(12) United States Patent
Araragi

(10) Patent No.: US 10,944,384 B2
(45) Date of Patent: Mar. 9, 2021

(54) DRIVE CIRCUIT FOR SWITCH

(71) Applicant: DENSO CORPORATION, Kariya (JP)

(72) Inventor: Akifumi Araragi, Kariya (JP)

(73) Assignee: DENSO CORPORATION, Kariya (JP)

( * ) Notice: Subject to any disclaimer, the term of this patent is extended or adjusted under 35 U.S.C. 154(b) by 253 days.

(21) Appl. No.: 15/954,904

(22) Filed: Apr. 17, 2018

(65) Prior Publication Data

US 2018/0309429 A1 Oct. 25, 2018

(30) Foreign Application Priority Data

Apr. 25, 2017 (JP) .............................. JP2017-086212

(51) Int. Cl.
*H03K 17/30* (2006.01)
*H03K 3/012* (2006.01)
*H03K 17/12* (2006.01)
*H03K 17/06* (2006.01)

(52) U.S. Cl.
CPC ............ *H03K 3/012* (2013.01); *H03K 17/122* (2013.01); *H03K 17/30* (2013.01); *H03K 17/302* (2013.01); *H03K 2017/066* (2013.01)

(58) Field of Classification Search
CPC .... H03K 3/012; H03K 17/122; H03K 17/302; H03K 17/30; H03K 2017/066; H03K 17/223; H03K 17/04106; H03K 17/04123; H03K 17/04163; H03K 17/063; H03K 17/08104; H03K 17/08122; H03K 17/08142
See application file for complete search history.

(56) References Cited

U.S. PATENT DOCUMENTS

2012/0099234 A1 4/2012 Inoue et al.
2013/0278300 A1* 10/2013 Domingo ........... H03K 17/0822
327/109

FOREIGN PATENT DOCUMENTS

JP H10-127044 A 5/1998
JP 2000-333442 A 11/2000

* cited by examiner

*Primary Examiner* — Jung Kim
(74) *Attorney, Agent, or Firm* — Oliff PLC

(57) ABSTRACT

A drive circuit drives a switch that has first and second terminals and a control terminal. The drive circuit includes a discharge path, a capacitor, an AC suppressor and a DC voltage generator. The discharge path connects the control terminal and the second terminal. The capacitor has a high-potential terminal connected to the second terminal side and a low-potential terminal connected to the control terminal side. The AC suppressor has a first end connected to a part of the discharge path between the high-potential terminal the second terminal. The DC voltage generator has a connection terminal connected to a second end of the AC suppressor. The DC voltage generator regulates electric current flowing between the connection terminal and the AC suppressor so as to keep the potential of the part of the discharge path between the high-potential terminal and the second terminal higher than the potential of the low-potential terminal.

7 Claims, 7 Drawing Sheets

$(Rs \times Cs > Tsw)$ (Rs×Cs>Tsw)

DRIVE CIRCUIT FOR SWITCH

CROSS-REFERENCE TO RELATED APPLICATION

This application is based on and claims priority from Japanese Patent Application No. 2017-86212 filed on Apr. 25, 2017, the content of which is hereby incorporated by reference in its entirety into this application.

BACKGROUND

1 Technical Field

The present invention relates to drive circuits for switches.

2 Description of Related Art

There are known switches which have a first terminal, a second terminal and a control terminal (or ON/OFF control terminal), such as a MOSFET (Metal-Oxide-Semiconductor Field-Effect Transistor) and an IGBT (Insulated Gate Bipolar Transistor). These switches are turned to an ON state when a potential difference of the control terminal with respect to the second terminal becomes higher than or equal to a threshold voltage; in the ON state, electric current is allowed to flow from the first terminal to the second terminal. On the other hand, these switches are turned to an OFF state when the potential difference becomes lower than the threshold voltage; in the OFF state, electric current is blocked from flowing from the first terminal to the second terminal.

Moreover, these switches have a reverse transfer capacitor formed between the first terminal and the control terminal. Therefore, in the OFF state, electric charge may be supplied to the control terminal via the reverse transfer capacitor. Consequently, the potential difference of the control terminal with respect to the second terminal may become higher than or equal to the threshold voltage, causing the switches, which are actually desired to be kept in the OFF state, to be accidentally turned to the ON state.

To solve the above problem, Japanese Patent Application Publication No. JP2012090435A discloses a drive circuit which has a buffer amplifier connected to the second terminal of a switch. The buffer amplifier functions to regulate electric current flowing between the buffer amplifier and the second terminal, so as to keep the potential of the control terminal at a negative potential that is lower than the potential of a discharge path connected to the control terminal. Consequently, a negative voltage is applied to the control terminal, thereby preventing the switch from being accidentally turned to the ON state.

However, in the drive circuit disclosed in the above patent document, to maintain the negative voltage, it is necessary to supply electric current to flow through the buffer amplifier. Consequently, high loss may occur in the buffer amplifier.

SUMMARY

According to exemplary embodiments, there is provided a drive circuit that drives a switch. The switch has a first terminal, a second terminal and a control terminal. The switch is configured to be turned to an ON state when a potential difference of the control terminal with respect to the second terminal becomes higher than or equal to an ON threshold voltage and turned to an OFF state when the potential difference becomes lower than an OFF threshold voltage. The switch allows electric current to flow from the first terminal to the second terminal in the ON state and blocks electric current from flowing from the first terminal to the second terminal in the OFF state. The drive circuit includes a discharge path, a capacitor, an AC suppressor and a DC voltage generator. The discharge path is provided to connect the control terminal and the second terminal of the switch and discharge electric charge from the control terminal. The capacitor is provided in the discharge path and has a high-potential terminal connected to the second terminal side and a low-potential terminal connected to the control terminal side. The AC suppressor is configured to suppress an AC component of electric current. The AC suppressor has a first end and a second end. The first end of the AC suppressor is connected to a part of the discharge path between the high-potential terminal of the capacitor and the second terminal of the switch. The DC voltage generator generates a reference DC voltage. The DC voltage generator has a connection terminal connected to the second end of the AC suppressor. The DC voltage generator is configured to regulate electric current flowing between the connection terminal and the AC suppressor so as to keep a potential of the part of the discharge path between the high-potential terminal of the capacitor and the second terminal of the switch higher than a potential of the low-potential terminal of the capacitor.

With the above configuration, electric current flowing between the connection terminal and the AC suppressor is regulated so as to keep the potential of the part of the discharge path between the high-potential terminal of the capacitor and the second terminal of the switch higher than the potential of the low-potential terminal of the capacitor. Consequently, it is possible to apply a negative voltage to the control terminal of the switch, thereby preventing the switch from being accidently turned to the ON state even when electric charge is supplied to the control terminal of the switch via a reverse transfer capacitor formed between the first terminal and the control terminal of the switch.

Moreover, with the above configuration, it is also possible to reduce loss occurring in the DC voltage generator. Specifically, during a charge process for turning the switch to the ON state, charge current is supplied to the control terminal of the switch, thereby increasing the potential difference of the control terminal with respect to the second terminal of the switch to become higher than or equal to the ON threshold voltage. Consequently, the switch is turned from the OFF state to the ON state, allowing electric current to flow from the first terminal to the second terminal of the switch. Moreover, during the charge process, electric current with an AC component flows to the capacitor via an equivalent control-terminal capacitor formed between the control terminal and the second terminal of the switch. However, the AC component of the electric current is suppressed by the AC suppressor from further flowing into the DC voltage generator via the connection terminal. As a result, it is possible to reduce the electric current flowing into the DC voltage generator via the connection terminal, thereby reducing loss in the DC voltage generator. On the other hand, during a discharge process for turning the switch to the OFF state, discharge current flows from the control terminal of the switch via the discharge path, thereby lowering the potential difference of the control terminal with respect to the second terminal of the switch to become lower than the OFF threshold voltage. Consequently, the switch is turned from the ON state to the OFF state, blocking electric current from flowing from the first terminal to the second terminal of the switch. Moreover, during the discharge process, electric current with an AC component flows from the capacitor to the control terminal of the switch via the equivalent control-terminal capacitor formed between the control terminal and the second terminal of the switch. At this time, electric current with an AC component is induced to flow from the connection terminal of the DC voltage generator to the capacitor. However, the AC component of the electric current is suppressed by the AC suppressor from flowing from the connection terminal of the DC voltage generator to the capacitor. As a result, it is possible to reduce the electric current flowing out of the DC voltage generator via the connection terminal, thereby reducing loss in the DC voltage generator.

Accordingly, with the above configuration, it is possible to effectively reduce loss occurring in the drive circuit while reliably preventing the switch from being accidentally turned from the OFF state to the ON state.

BRIEF DESCRIPTION OF THE DRAWINGS

The present invention will be understood more fully from the detailed description given hereinafter and from the accompanying drawings of exemplary embodiments, which, however, should not be taken to limit the present invention to the specific embodiments but are for the purpose of explanation and understanding only.

In the accompanying drawings.

DESCRIPTION OF EMBODIMENTS

Figure 1:
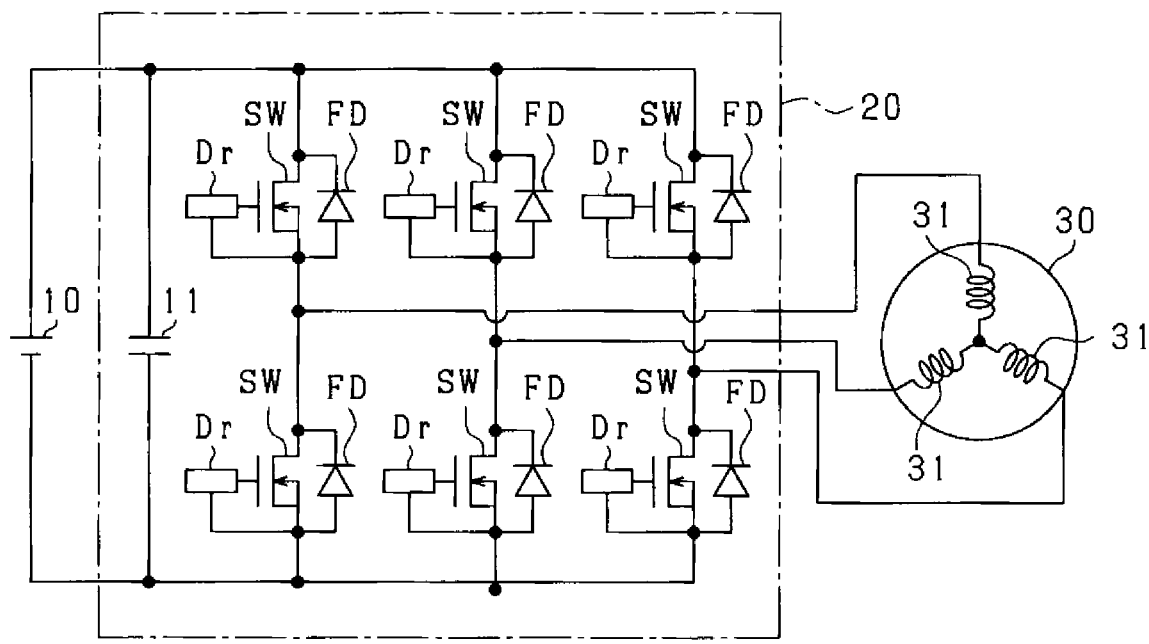
FIG. 1 is a schematic view illustrating the overall configuration of a rotating electric machine system.

Exemplary embodiments will be described hereinafter with reference to FIGS. 1-12. It should be noted that for the sake of clarity and understanding, identical components having identical functions throughout the whole description have been marked, where possible, with the same reference numerals in each of the figures and that for the sake of avoiding redundancy, descriptions of identical components will not be repeated.

First Embodiment

FIG. 1 shows the overall configuration of a rotating electric machine system to which drive circuits Dr according to a first embodiment are applied.

As shown in FIG. 1, the rotating electric machine system includes a battery 10 as a DC power supply, an inverter 20 as an electric power converter, and a three-phase rotating electric machine 30.

The rotating electric machine 30 includes three phase windings 31 that are star-connected to define a neutral point therebetween. The rotating electric machine 30 is electrically connected to the battery 10 via the inverter 20. Moreover, between the battery 10 and the inverter 20, there is provided a smoothing capacitor 11. In addition, the rotating electric machine 30 may be implemented by, for example, a permanent magnet synchronous machine.

The inverter 20 includes three switch pairs each consisting of an upper-arm switch SW and a lower-arm switch SW connected in series with each other. For each of the switch pairs, there is connected a first end of a corresponding one of the phase windings 31 of the rotating electric machine 30 to a node (or junction point) between the upper-arm and lower-arm switches SW of the switch pair. In addition, second ends of the phase windings 31 of the rotating electric machine 30 are connected together at the neutral point.

In the present embodiment, each of the switches SW of the inverter 20 is implemented by a voltage-controlled semiconductor switching element, more particularly by an N-channel MOSFET.

Accordingly, for each of the switches SW of the inverter 20, the gate of the switch SW corresponds to a control terminal (or ON/OFF control terminal); the drain of the switch SW corresponds to a first terminal; and the source of the switch SW corresponds to a second terminal.

Moreover, each of the switches SW has a body diode FD connected in antiparallel (or inverse parallel) thereto. It should be appreciated that each of the switches SW may alternatively have an external freewheeling (or flyback) diode FD connected in antiparallel thereto.

The inverter 20 also includes six drive circuits Dr each of which is provided to drive a corresponding one of the six switches SW. The drive circuits Dr drive the corresponding switches SW such that for each of the three switch pairs, the upper-arm and lower-arm switches SW of the switch pair are alternately turned to an ON state in each switching period Tsw.

In the present embodiment, all of the drive circuits Dr have the same configuration. Therefore, for the sake of avoiding redundancy, only one of the drive circuits Dr and the corresponding switch SW will be described in detail with reference to FIGS. 2-4.

Figure 2:
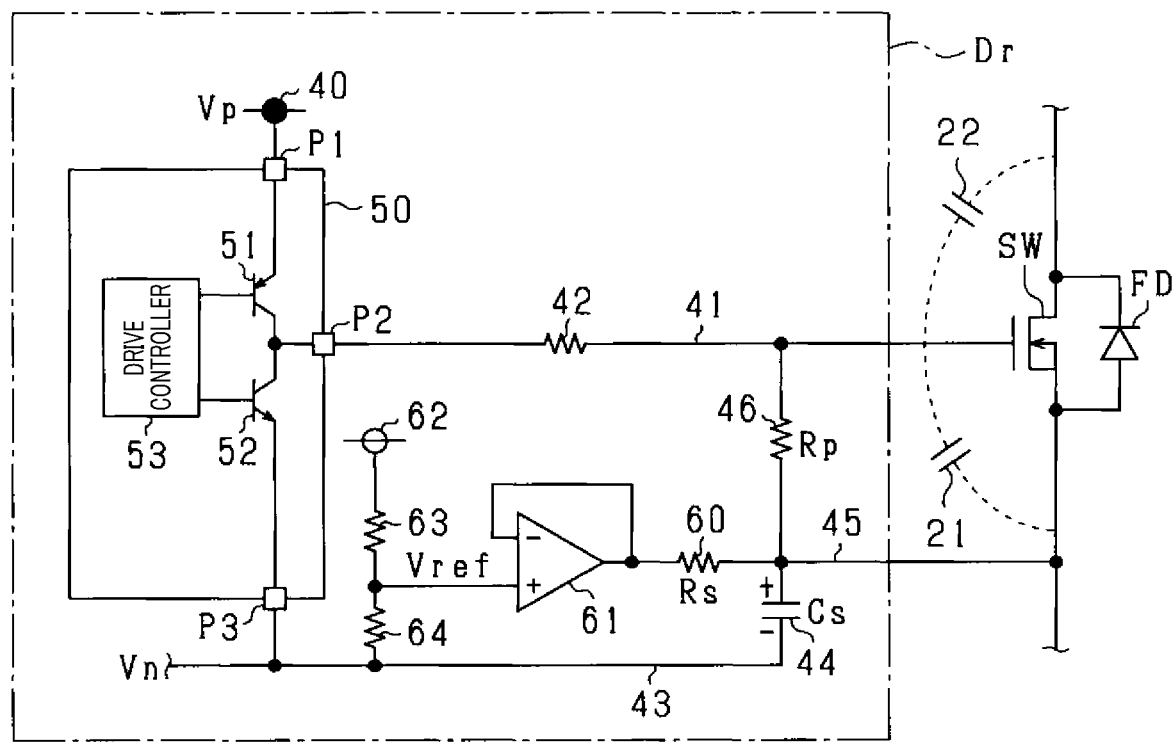
FIG. 2 is a schematic circuit diagram of a drive circuit, according to a first embodiment, for driving a switch in the rotating electric machine system.

As shown in FIG. 2, the drive circuit Dr includes a main power supply 40 and a drive IC 50. The drive IC 50, which is an integrated circuit, includes a charge switch 51 and a discharge switch 52. In the present embodiment, the charge switch 51 is implemented by a PNP transistor whereas the discharge switch 52 is implemented by an NPN transistor.

In addition, in FIG. 2, there are also shown an equivalent gate capacitor 21 and a reverse transfer capacitor 22 both of which relate to the input capacitance of the switch SW.

The drive IC 50 has a first terminal P1 to which are connected both the main power supply 40 and the emitter of the charge switch 51. The drive IC 50 also has a second terminal P2 to which are connected both the collector of the charge switch 51 and the collector of the discharge switch 52. Moreover, to the second terminal P2, there is also connected the gate of the switch SW via a first electrical path 41. In addition, in the first electrical path 41, there is provided a gate resistor 42.

In the present embodiment, an electrical path from the first terminal P1 to the second terminal P2 in the drive IC 50 and the first electrical path 41 together constitute a charge path for charging the gate of the switch SW with electric charge.

The drive IC 50 also has a third terminal P3 to which is connected the emitter of the discharge switch 52. Moreover, to the third terminal P3, there is also connected a low-potential terminal of a capacitor 44 via a second electrical path 43. On the other hand, to a high-potential terminal of the capacitor 44, there is connected the source of the switch SW via a third electrical path 45. The capacitor 44 has a function of temporarily storing charge/discharge electric-charge during each switching operation of the switch SW.

In the present embodiment, the first electrical path 41, an electrical path from the second terminal P2 to the third terminal P3 in the drive IC 50, the second electrical path 43 and the third electrical path 45 together constitute a discharge path for discharging electric charge from the gate of the switch SW. That is, the discharge path shares the first electrical path 41 with the charge path.

The drive circuit Dr includes a pull-down resistor 46. The pull-down resistor 46 has a first end connected to a part of the first electrical path 41 which is located closer than the gate resistor 42 to the gate of the switch SW. The pull-down resistor 46 also has a second end connected to the third electrical path 45. The pull-down resistor 46 is provided to prevent a situation in which it is impossible to discharge electric charge from the gate of the switch SW in, for example, a fault condition where the discharge switch 52 cannot be turned on. In addition, the resistance Rp of the pull-down resistor 46 is set to be greater than the resistance of the gate resistor 42.

The drive circuit Dr also includes a limiting resistor 60, an operational amplifier 61, a reference power supply 62, a first resistor 63 and a second resistor 64.

The limiting resistor 60 has a first end connected to the third electrical path 45 and a second end connected to an output terminal of the operational amplifier 61. To an inverting input terminal of the operational amplifier 61, there is connected the second end of the limiting resistor 60.

In the present embodiment, the limiting resistor 60 constitutes an AC suppressor. The limiting resistor 60, the operational amplifier 61, the reference power supply 62, the first resistor 63 and the second resistor 64 together constitute a DC voltage generator. The output terminal of the operational amplifier 61 corresponds to a connection terminal of the DC voltage generator.

To the reference power supply 62, there is connected the second electrical path 43 via the first and second resistors 63 and 64 that are connected in series with each other. To a node between the first and second resistors 63 and 64, there is connected a non-inverting input terminal of the operational amplifier 61.

In the present embodiment, the potential difference of the non-inverting input terminal of the operational amplifier 61 with respect to the second electrical path 43 is defined as a reference DC voltage Vref. The operational amplifier 61 operates to keep the potential difference of the output terminal of the operational amplifier 61 with respect to the second electrical path 43 at the reference voltage Vref.

The drive IC 50 includes a drive controller 53. The drive controller 53 determines whether a drive signal inputted from an external control apparatus (not shown) provided outside the drive circuit Dr indicates an ON command or an OFF command. When it is determined that the drive signal indicates the ON command, the drive controller 53 performs a charge process to turn the switch SW to the ON state. In contrast, when it is determined that the drive signal indicates the OFF command, the drive controller 53 performs a discharge process to turn the switch SW to an OFF state.

Next, both the charge process and the discharge process performed by the drive controller 53 will be described with reference to FIG. 3.

Figure 3:
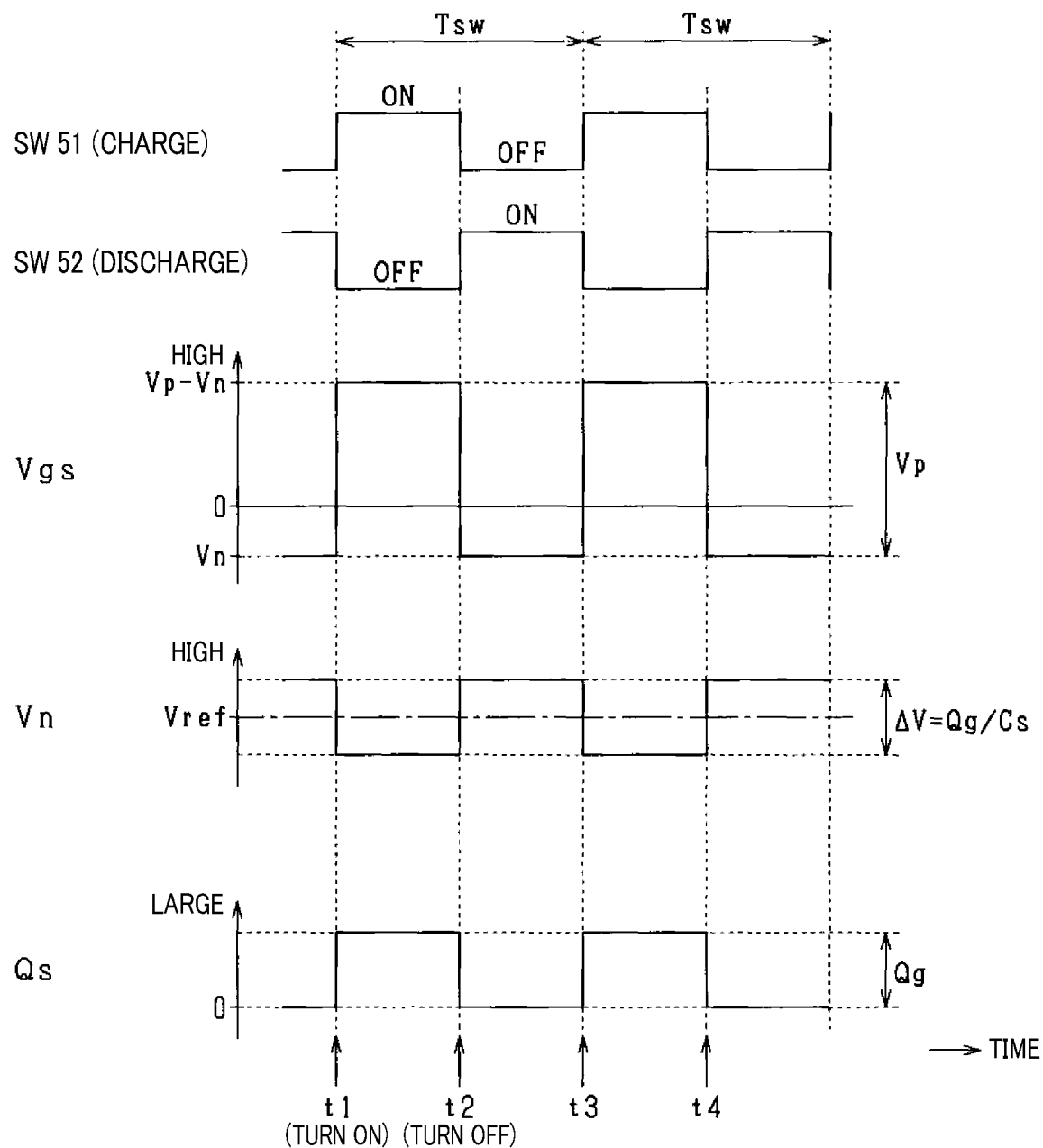
FIG. 3 is a time chart illustrating both a charge process and a discharge process of the drive circuit according to the first embodiment.

In FIG. 3, there are shown: the change with time of the drive state (or ON/OFF state) of the charge switch 51; the change with time of the drive state of the discharge switch 52; the change with time of a gate voltage Vgs which is defined as the potential difference of the gate with respect to the source of the switch SW; the change with time of a negative voltage Vn (<0) which is defined as the potential difference of the second electrical path 43 with respect to the source of the switch SW; and the change with time of an actual electric charge quantity Qs which is the actual quantity of electric charge accumulated in the capacitor 44. In addition, in FIG. 3, Vp (>0) represents a power supply voltage which is defined as the potential difference of the main power supply 40 with respect to the second electrical path 43.

At a time instant t1, the drive signal is switched from the OFF command to the ON command, causing the drive controller 53 to perform the charge process. In the charge process, the charge switch 51 is turned to the ON state whereas the discharge switch 52 is turned to the OFF state. Consequently, electric charge is supplied from the main power supply 40 to the gate of the switch SW via the charge switch 51 and the first electrical path 41, thereby increasing the gate voltage Vgs to become substantially equal to (Vp−Vn) that is higher than or equal to an ON threshold voltage. As a result, the switch SW is turned from the OFF state to the ON state, allowing electric current to flow from the drain to the source of the switch SW.

Moreover, during the charge process, charge electric-charge flows from the main power supply 40 to the capacitor 44 via the first electrical path 41 and the equivalent gate capacitor 21. Then, all or most of the charge electric-charge is stored in the capacitor 44. Therefore, as shown in FIG. 3, the actual electric charge quantity Qs during the charge process is greater than the actual electric charge quantity Qs during the discharge process by the gate charge capacity Qg of the switch SW. In other words, variation in the actual electric charge quantity Qs during the ON/OFF operation of the switch SW is equal to Qg.

In the present embodiment, the drive circuit Dr includes the limiting resistor 60 that suppresses electric current with an AC component, which has flowed to the capacitor 44 via the equivalent gate capacitor 21 during the charge process, from further flowing to the operational amplifier 61. Consequently, all or most of the charge electric-charge is caused to accumulate in the capacitor 44.

Moreover, in the present embodiment, the resistance Rs of the limiting resistor 60 and the capacitance Cs of the capacitor 44 are set to satisfy the following relationship (eq1):

$$Rs \times Cs > Tsw \qquad (eq1)$$

where Tsw is the switching period of the switch SW.

Satisfying the above relationship (eq1), it is possible to more effectively suppress, by the limiting resistor 60, the electric current with an AC component from flowing from the capacitor 44 to the operational amplifier 61.

Referring back to FIG. 3, at a time instant t2, the drive signal is switched from the ON command to the OFF command, causing the drive circuit 53 to perform the discharge process. In the discharge process, the charge switch 51 is turned to the OFF state whereas the discharge switch 52 is turned to the ON state. Consequently, electric charge is discharged from the gate of the switch SW via the first electrical path 41, the discharge switch 52 and the second electrical path 43, thereby lowering the gate voltage Vgs to become substantially equal to Vn that is lower than an OFF threshold voltage. As a result, the switch SW is turned from the ON state to the OFF state, blocking electric current from flowing from the drain to the source of the switch SW. In addition, it should be noted that the OFF threshold voltage may be set to be either equal to or different from the ON threshold voltage.

Moreover, during the discharge process, electric charge, which has been stored in the capacitor 44 during the charge process, are discharged from the capacitor 44 via the equivalent gate capacitor 21, the first electrical path 41, the discharge switch 52 and the second electrical path 43. At this time, electric current with an AC component is induced to flow from the output terminal of the operational amplifier 61 to the capacitor 44. However, the AC component of the electric current is suppressed by the limiting resistor 60 from flowing from the output terminal of the operational amplifier 61 to the capacitor 44.

In addition, in the present embodiment, the resistance Rs of the limiting resistor 60 and the capacitance Cs of the capacitor 44 are set to satisfy the above relationship (eq1). Consequently, it is possible to more effectively suppress, by the limiting resistor 60, the AC component of the electric current from flowing from the output terminal of the operational amplifier 61 to the capacitor 44.

At a time instant t3 after one switching period Tsw from the time instant t1, the discharge process is ended and the charge process is started again. Then, at a time instant t4, the charge process is ended and the discharge process is started again.

In the manner described above, the charge and discharge processes are repeated. Moreover, during the repeated charge and discharge processes, it is possible to reduce electric current flowing through the operational amplifier 61, thereby reducing loss in the operational amplifier 61.

In addition, as shown in FIG. 3, the negative voltage Vn varies with time around the reference voltage Vref. More specifically, the difference $\Delta V$ between the negative voltage Vn during the charge process (e.g., during the ON durations t1-t2 and t3-t4) and the negative voltage Vn during the discharge process (e.g., during the OFF duration t2-t3) is equal to Qg/Cs. In addition, the reference voltage Vref can be regarded as a reference voltage for the negative voltage Vn.

Next, the effect of the pull-down resistor 46 will be described.

Referring again to FIG. 2, in the drive circuit Dr, DC current steadily flows to the limiting resistor 60 via the pull-down resistor 46. Consequently, a voltage drop occurs across the limiting resistor 60. Thus, there also occurs a voltage error $\Delta Ver$ which is the difference between a source voltage Vs and the reference voltage Vref. Here, the source voltage Vs is defined as the potential difference of the high-potential terminal of the capacitor 44 with respect to the second electrical path 43. In addition, the reference voltage Vref can also be regarded as a reference voltage for the source voltage Vs.

Figure 4:
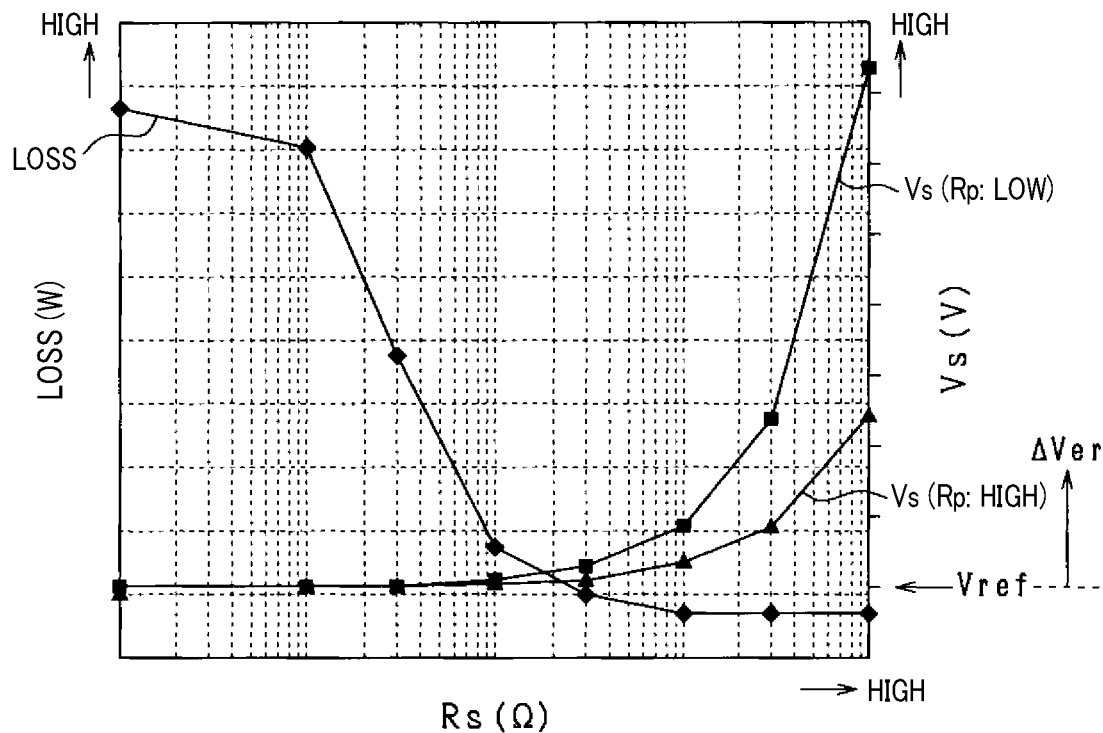
FIG. 4 is a graphical representation illustrating the relationship between the resistance Rs of a limiting resistor, the resistance Rp of a pull-down resistor, a source voltage Vs and loss occurring in an operational amplifier in the drive circuit according to the first embodiment.

As shown in FIG. 4, the voltage error $\Delta Ver$ decreases with decrease in the resistance Rs of the limiting resistor 60. However, with decrease in the resistance Rs of the limiting resistor 60, the effect of the limiting resistor 60 on the suppression of an AC component of electric current flowing through the operational amplifier 61 is reduced, thus increasing loss in the operational amplifier 61.

On the other hand, with increase in the resistance Rs of the limiting resistor 60, loss occurring in the operational amplifier 61 decreases. However, with increase in the resistance Rs of the limiting resistor 60, the voltage error $\Delta Ver$ also increases.

In contrast, with increase in the resistance Rp of the pull-down resistor 46, the voltage error $\Delta Ver$ decreases.

Therefore, by suitably setting the resistance Rs of the limiting resistor 60 and the resistance Rp of the pull-down resistor 46, it is possible to effectively reduce loss occurring in the operational amplifier 16 while reliably preventing the switch SW from being accidentally turned from the OFF state to the ON state.

In addition, in the present embodiment, the resistance Rs of the limiting resistor 60 is set to be less than the resistance Rp of the pull-down resistor 46.

According to the present embodiment, it is possible to achieve the following advantageous effects.

In the present embodiment, a drive circuit Dr drives a switch SW that is implemented by an N-channel MOSFET having a drain (i.e., first terminal), a source (i.e., second terminal) and a gate (i.e., control terminal). The switch SW is configured to be turned to the ON state when the potential difference of the gate with respect to the source becomes higher than or equal to the ON threshold voltage and turned to the OFF state when the potential difference becomes lower than the OFF threshold voltage. The switch SW allows electric current to flow from the drain to the source in the ON state and blocks electric current from flowing from the drain to the source in the OFF state. The drive circuit Dr includes the discharge path, the capacitor 44, the AC suppressor and the DC voltage generator. The discharge path is provided to connect the gate and the source of the switch SW and discharge electric charge from the gate. More particularly, in the present embodiment, the discharge path is constituted of the first electrical path 41, the electrical path from the second terminal P2 to the third terminal P3 in the drive IC 50, the second electrical path 43 and the third electrical path 45. The capacitor 44 is provided in the discharge path (more particularly, between the second and third electrical paths 43 and 45 in the present embodiment) and has its high-potential terminal connected to the source of the switch SW via the third electrical path 45 and its low-potential terminal connected to the gate of the switch SW via the second electrical path 43, the electrical path between the second and third terminals P2 and P3 in the drive IC 50 and the first electrical path 41. The AC suppressor, which is constituted of the limiting resistor 60 in the present embodiment, has its first end connected to a part of the discharge path between the high-potential terminal of the capacitor 44 and the source of the switch SW (more particularly, to the third electrical path 45 in the present embodiment). The DC voltage generator generates the reference DC voltage Vref and thus the source voltage Vs applied to the source of the switch SW. More particularly, in the present embodiment, the DC voltage generator is constituted of the limiting resistor 60, the operational amplifier 61, the reference power supply 62, the first resistor 63 and the second resistor 64. The DC voltage generator has the connection terminal (more particularly, the output terminal of the operational amplifier 61 in the present embodiment) connected to the second end of the AC suppressor. The DC voltage generator is configured to regulate electric current flowing between the connection terminal and the AC suppressor so as to keep the potential of the part of the discharge path between the high-potential terminal of the capacitor 44 and the source of the switch SW (more particularly, the potential of the third electrical path 45 in the present embodiment) higher than the potential of the low-potential terminal of the capacitor 44.

With the above configuration, electric current flowing between the connection terminal and the AC suppressor is regulated so as to keep the potential of the part of the discharge path between the high-potential terminal of the capacitor 44 and the source of the switch SW higher than the potential of the low-potential terminal of the capacitor 44. Consequently, it is possible to apply the negative voltage Vn to the gate of the switch SW, thereby preventing the switch SW from being accidently turned to the ON state even when electric charge is supplied to the gate of the switch SW via the reverse transfer capacitor 22 formed between the drain and the gate of the switch SW.

Moreover, with the above configuration, it is also possible to reduce loss occurring in the DC voltage generator. Specifically, during the charge process for turning the switch SW to the ON state, charge current is supplied to the gate of the switch SW, thereby increasing the potential difference of the gate with respect to the source of the switch SW (i.e., the gate voltage Vgs) to become higher than or equal to the ON threshold voltage. Consequently, the switch SW is turned from the OFF state to the ON state, allowing electric current to flow from the drain to the source of the switch SW. Moreover, during the charge process, electric current with an AC component flows to the capacitor 44 via the equivalent gate capacitor 21 formed between the gate and the source of the switch SW. However, the AC component of the electric current is suppressed by the AC suppressor from further flowing into the DC voltage generator via the connection terminal. As a result, it is possible to reduce the electric current flowing into the DC voltage generator via the connection terminal, thereby reducing loss in the DC voltage generator. On the other hand, during the discharge process for turning the switch SW to the OFF state, discharge current flows from the gate of the switch SW via the discharge path, thereby lowering the potential difference of the gate with respect to the source of the switch SW to become lower than the OFF threshold voltage. Consequently, the switch SW is turned from the ON state to the OFF state, blocking electric current from flowing from the drain to the source of the switch SW. Moreover, during the discharge process, electric current with an AC component flows from the capacitor 44 to the gate of the switch SW via the equivalent gate capacitor 21 formed between the gate and the source of the switch SW. At this time, electric current with an AC component is induced to flow from the connection terminal of the DC voltage generator to the capacitor 44. However, the AC component of the electric current is suppressed by the AC suppressor from flowing from the connection terminal of the DC voltage generator to the capacitor 44. As a result, it is possible to reduce the electric current flowing out of the DC voltage generator via the connection terminal, thereby reducing loss in the DC voltage generator.

Accordingly, with the above configuration, it is possible to effectively reduce loss occurring in the drive circuit Dr while reliably preventing the switch SW from being accidentally turned from the OFF state to the ON state.

In the present embodiment, the AC suppressor is constituted of the limiting resistor 60. Moreover, the resistance Rs of the limiting resistor 60 and the capacitance Cs of the capacitor 44 are set to satisfy the above relationship (eq1).

With the above configuration, it is possible to improve the effect of the AC suppressor on the suppression of an AC component of electric current flowing into/out of the DC voltage generator via the connection terminal. Consequently, it is possible to more effectively reduce loss in the DC voltage generator.

In the present embodiment, the DC voltage generator includes the operational amplifier 61 that has: the inverting input terminal connected to the second end of the AC suppressor; the non-inverting input terminal to which the reference DC voltage Vref is applied; and the output terminal that constitutes the connection terminal of the DC voltage generator.

With the above configuration, it is possible to suitably regulate, by the operational amplifier 61 and the limiting resistor 60 (i.e., the AC suppressor), electric current flowing between the output terminal of the operational amplifier 61 (i.e., the connection terminal) and the limiting resistor 60, thereby reliably keeping the potential of the third electrical path 45 (i.e., the part of the discharge path between the high-potential terminal of the capacitor 44 and the source of the switch SW) higher than the potential of the low-potential terminal of the capacitor 44. Consequently, it is possible to reliably apply the negative voltage Vn to the gate of the switch SW, thereby reliably preventing the switch SW from being accidently turned to the ON state even when electric charge is supplied to the gate of the switch SW via the reverse transfer capacitor 22 formed between the drain and the gate of the switch SW.

Moreover, loss occurring in the operational amplifier 61 increases both with the gate charge capacity Qg of the switch SW and with the switching frequency fsw (=1/Tsw) of the switch SW. Accordingly, reduction in the loss occurring in the operational amplifier 61, which is achievable with the limiting resistor 60, is particularly remarkable when the gate charge capacity Qg of the switch SW is large or/and the switching frequency fsw of the switch SW is high.

Second Embodiment

Figure 5:
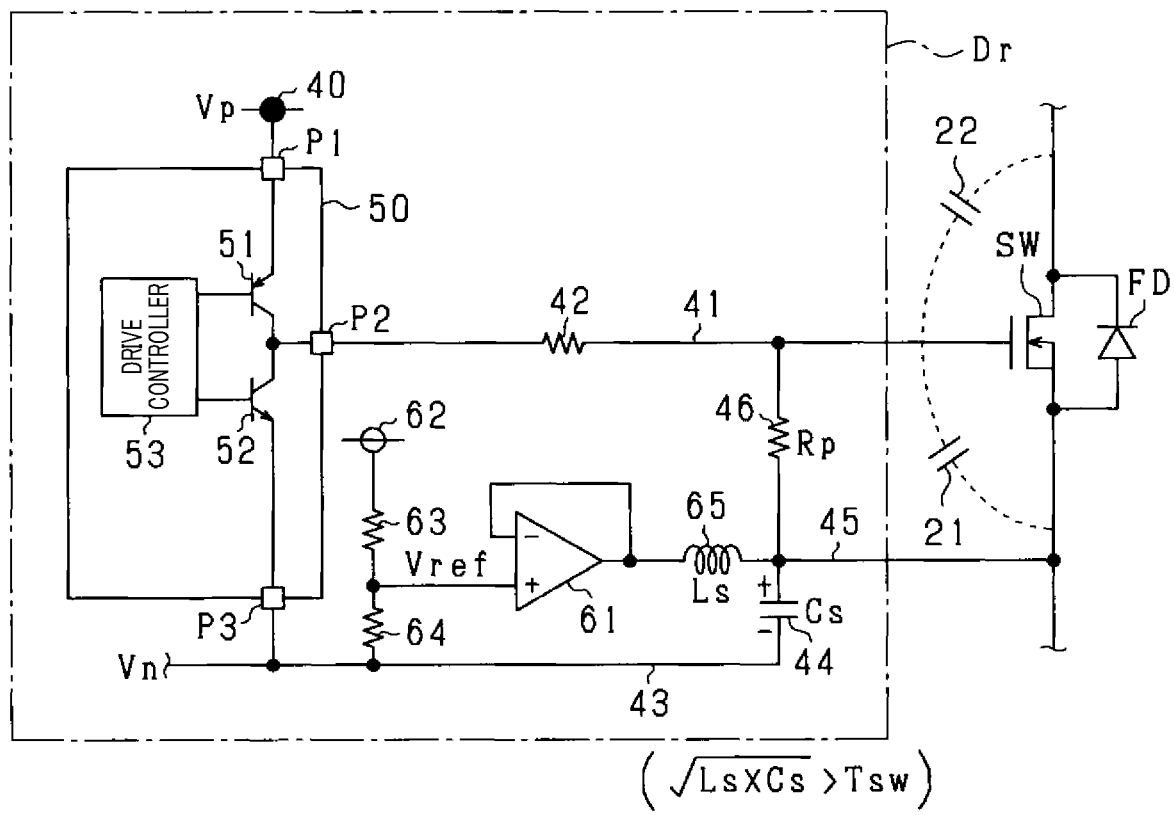
FIG. 5 is a schematic circuit diagram of a drive circuit according to a second embodiment.

FIG. 5 shows the configuration of a drive circuit Dr according to a second embodiment.

The drive circuit Dr according to the second embodiment is similar to that according to the first embodiment. Therefore, only the differences therebetween will be described hereinafter.

As shown in FIG. 5, in the present embodiment, the drive circuit Dr includes an inductor 65, which is a passive element, instead of the limiting resistor 60 (see FIG. 2) described in the first embodiment.

The inductor 65 functions as an AC suppressor to suppress an AC component of electric current from flowing into/out of the operational amplifier 61.

Moreover, in the present embodiment, the inductance Ls of the inductor 65 and the capacitance Cs of the capacitor 44 are set to satisfy the following relationship (eq2):

$$\sqrt{Ls \times Cs} > Tsw \qquad (eq2)$$

where Tsw is the switching period of the switch SW.

Satisfying the above relationship (eq2), it is possible to improve the effect of the inductor 65 on the suppression of an AC component of electric current flowing into/out of the operational amplifier 61. Consequently, it is possible to more effectively reduce loss in the operational amplifier 61.

According to the present embodiment, it is also possible to achieve the same advantageous effects as described in the first embodiment.

Moreover, in the present embodiment, the AC suppressor is constituted of the inductor 65. Consequently, compared to the first embodiment where the AC suppressor is constituted of the limiting resistor 60, it is possible to reduce the voltage drop across the AC suppressor when DC current flows to the AC suppressor via the pull-down resistor 46.

Third Embodiment

Figure 6:
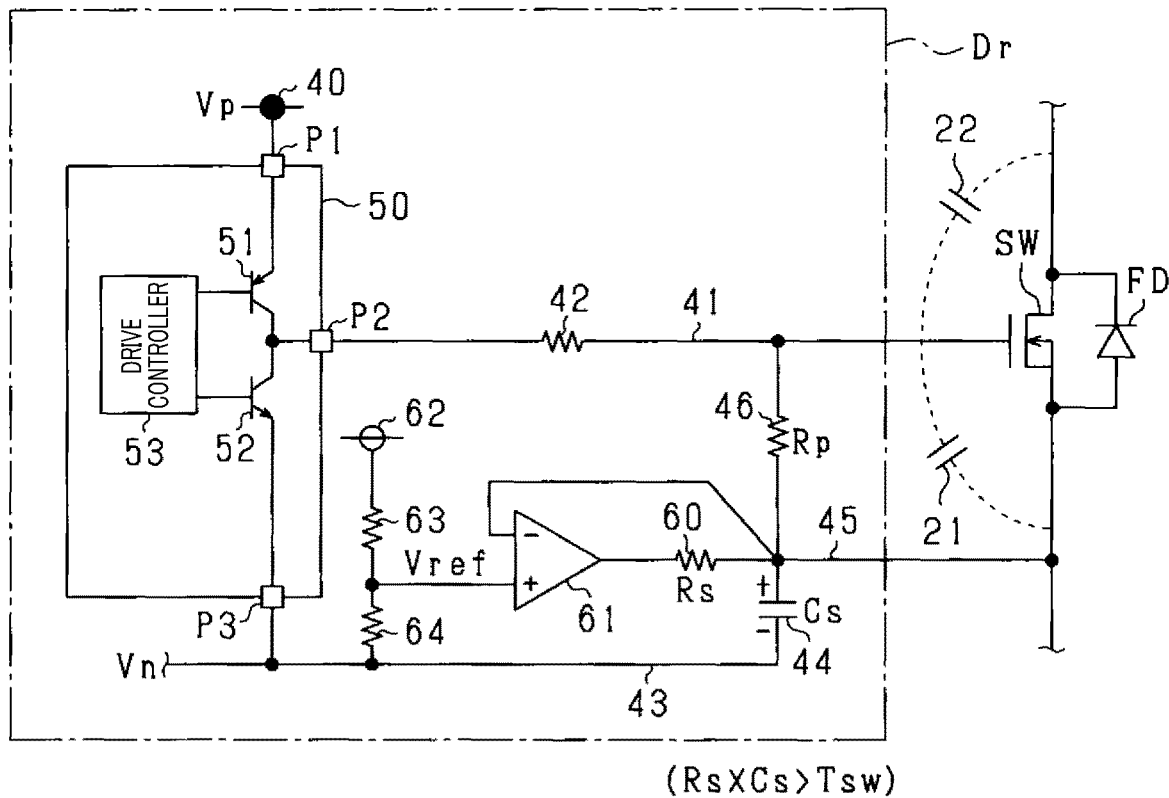
FIG. 6 is a schematic circuit diagram of a drive circuit according to a third embodiment.

FIG. 6 shows the configuration of a drive circuit Dr according to a third embodiment.

The drive circuit Dr according to the third embodiment is similar to that according to the first embodiment. Therefore, only the differences therebetween will be described hereinafter.

As shown in FIG. 6, in the present embodiment, the inverting input terminal of the operational amplifier 61 is connected to the first end of the limiting resistor 60 (i.e., the AC suppressor), not to the second end of the limiting resistor 60 as in the first embodiment. The operational amplifier 61 operates to keep the potential difference of the first end of the limiting resistor 60 with respect to the second electrical path 43 at the reference voltage Vref.

According to the present embodiment, it is also possible to achieve the same advantageous effects as described in the first embodiment.

Moreover, in the present embodiment, the operational amplifier 61 operates to keep the potential difference of the first end of the limiting resistor 60 with respect to the second electrical path 43 at the reference voltage Vref. Consequently, compared to the first embodiment, it is possible to considerably reduce the voltage error ΔVer when DC current flows to the limiting resistor 60 via the pull-down resistor 46. In addition, as described previously, the voltage error ΔVer is the difference between the source voltage Vs and the reference voltage Vref; in the first embodiment, the operational amplifier 61 operates to keep the potential difference of the output terminal of the operational amplifier 61 with respect to the second electrical path 43 at the reference voltage Vref.

Fourth Embodiment

Figure 7:
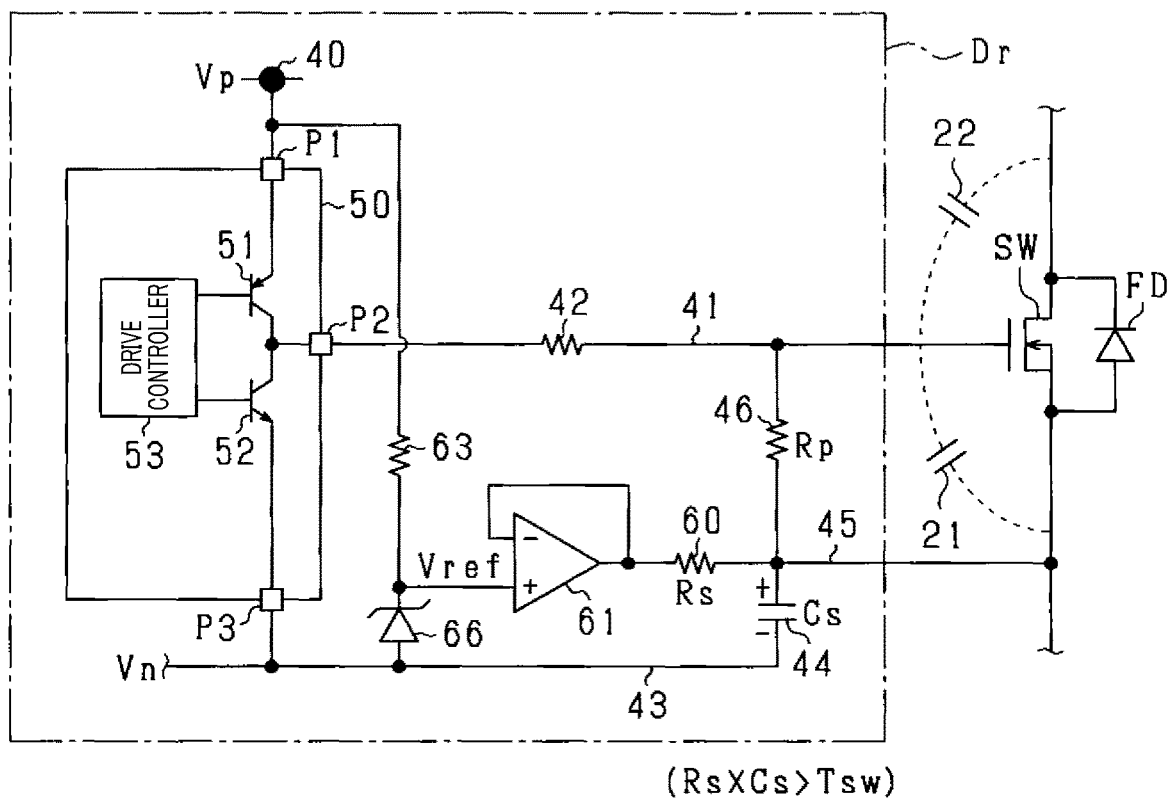
FIG. 7 is a schematic circuit diagram of a drive circuit according to a fourth embodiment.

FIG. 7 shows the configuration of a drive circuit Dr according to a fourth embodiment.

The drive circuit Dr according to the fourth embodiment is similar to that according to the first embodiment. Therefore, only the differences therebetween will be described hereinafter.

As shown in FIG. 7, in the present embodiment, no reference power supply 62 is provided in the drive circuit Dr. Moreover, the drive circuit Dr includes a Zener diode 66, instead of the second resistor 64 (see FIG. 2) described in the first embodiment.

The Zener diode 66 has its anode connected to the second electrical path 43 and its cathode connected to a first end of the first resistor 63. To a second end of the first resistor 63, there is connected the main power supply 40. Moreover, the Zener voltage of the Zener diode 66 is set to the reference DC voltage Vref.

According to the present embodiment, it is also possible to achieve the same advantageous effects as described in the first embodiment.

Fifth Embodiment

Figure 8:
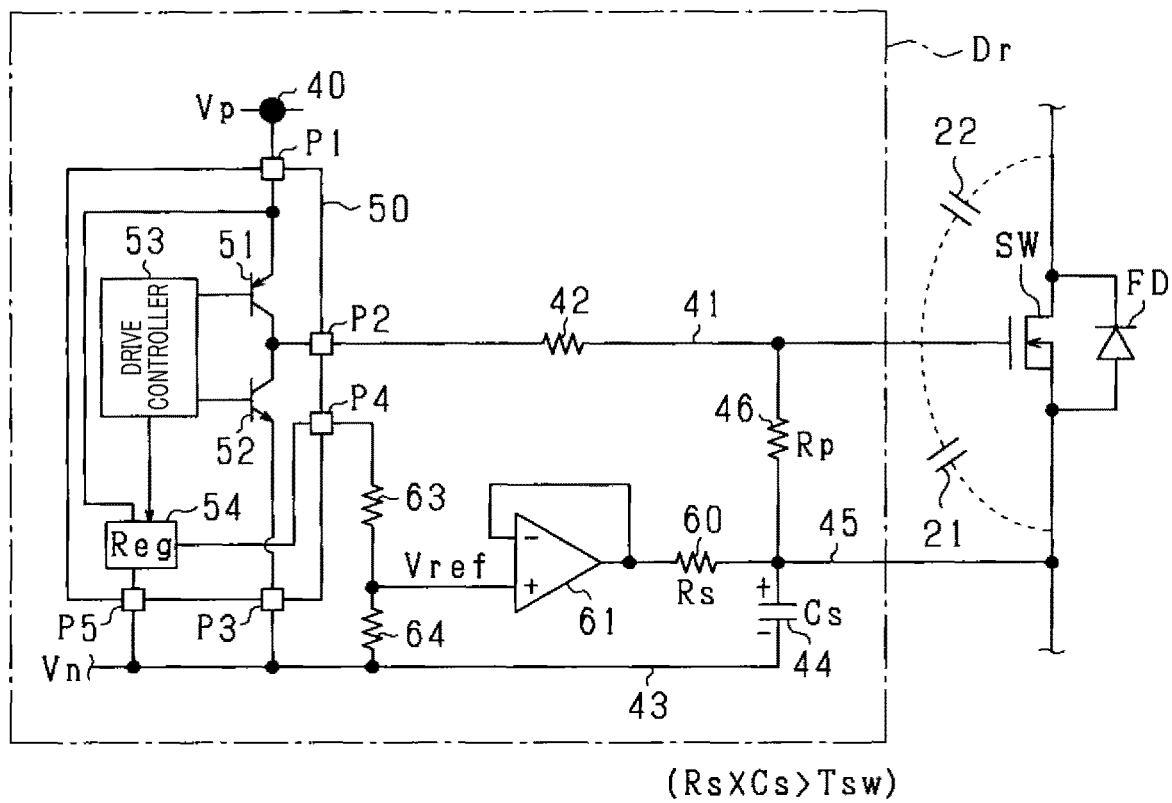
FIG. 8 is a schematic circuit diagram of a drive circuit according to a fifth embodiment.

FIG. 8 shows the configuration of a drive circuit Dr according to a fifth embodiment.

The drive circuit Dr according to the fifth embodiment is similar to that according to the first embodiment. Therefore, only the differences therebetween will be described hereinafter.

As shown in FIG. 8, in the present embodiment, the drive circuit Dr includes a voltage regulator 54, instead of the reference power supply 62 (see FIG. 2) described in the first embodiment.

The voltage regulator 54 is provided in the drive IC 50. The voltage regulator 54 has an input terminal connected to the first terminal P1 of the drive IC 50 and an output terminal connected to a fourth terminal P4 of the drive IC 50. To the fourth terminal P4, there is connected the first resistor 63. In addition, the voltage regulator 54 is also connected to the second electrical path 43 via a fifth terminal P5 of the drive IC 50.

The voltage regulator 54 regulates (or converts) the output voltage of the main power supply 40 to a voltage that is equal to the output voltage of the reference power supply 62 described in the first embodiment, and outputs the resultant voltage to the first resistor 63 via the fourth terminal P4.

According to the present embodiment, it is also possible to achieve the same advantageous effects as described in the first embodiment.

Sixth Embodiment

Figure 9:
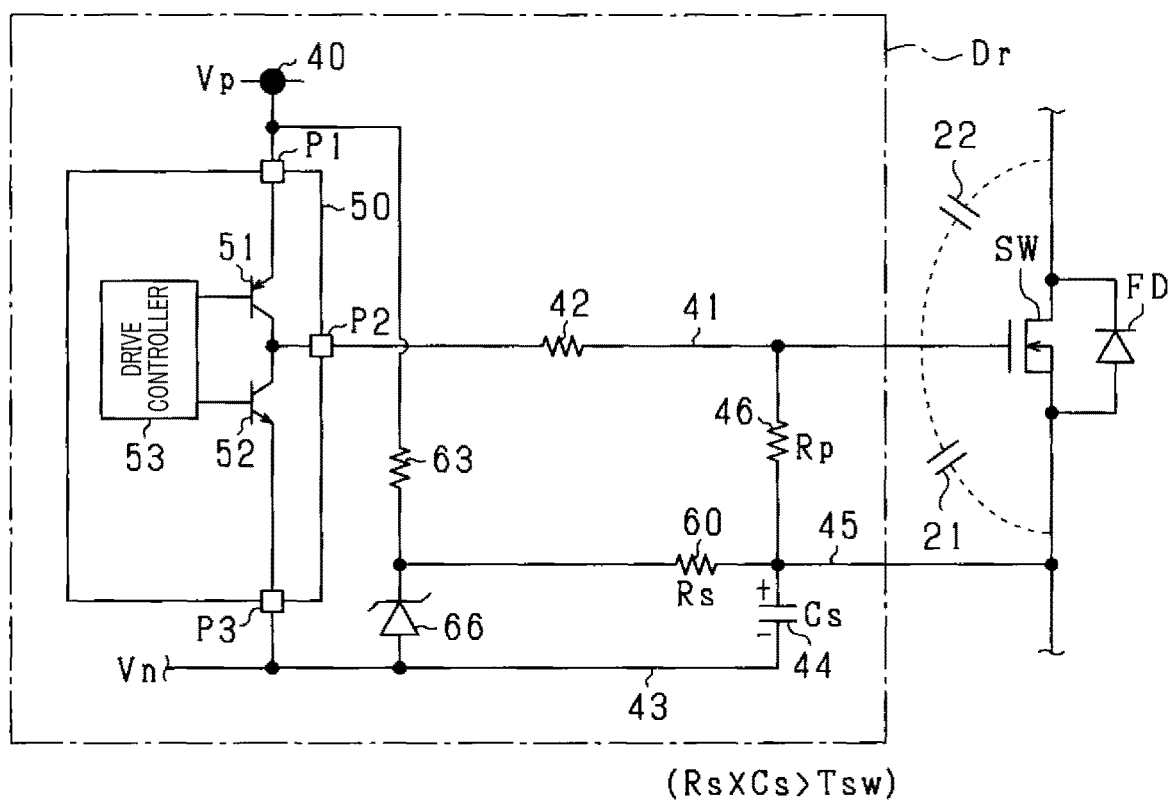
FIG. 9 is a schematic circuit diagram of a drive circuit according to a sixth embodiment.

FIG. 9 shows the configuration of a drive circuit Dr according to a sixth embodiment.

The drive circuit Dr according to the sixth embodiment is similar to that according to the fourth embodiment. Therefore, only the differences therebetween will be described hereinafter.

As shown in FIG. 9, in the present embodiment, the drive circuit Dr includes no operational amplifier 61, unlike the drive circuit Dr according to the fourth embodiment (see FIG. 7). Accordingly, in the present embodiment, the cathode of the Zener diode 66 is directly connected to the second end of the limiting resistor 60.

In the present embodiment, the main power supply 40, the limiting resistor 60, the first resistor 63 and the Zener diode 66 together constitute a DC voltage generator. The cathode of the Zener diode 66 corresponds to a connection terminal of the DC voltage generator.

According to the present embodiment, it is also possible to achieve the same advantageous effects as achievable according to the fourth embodiment.

Seventh Embodiment

Figure 10:
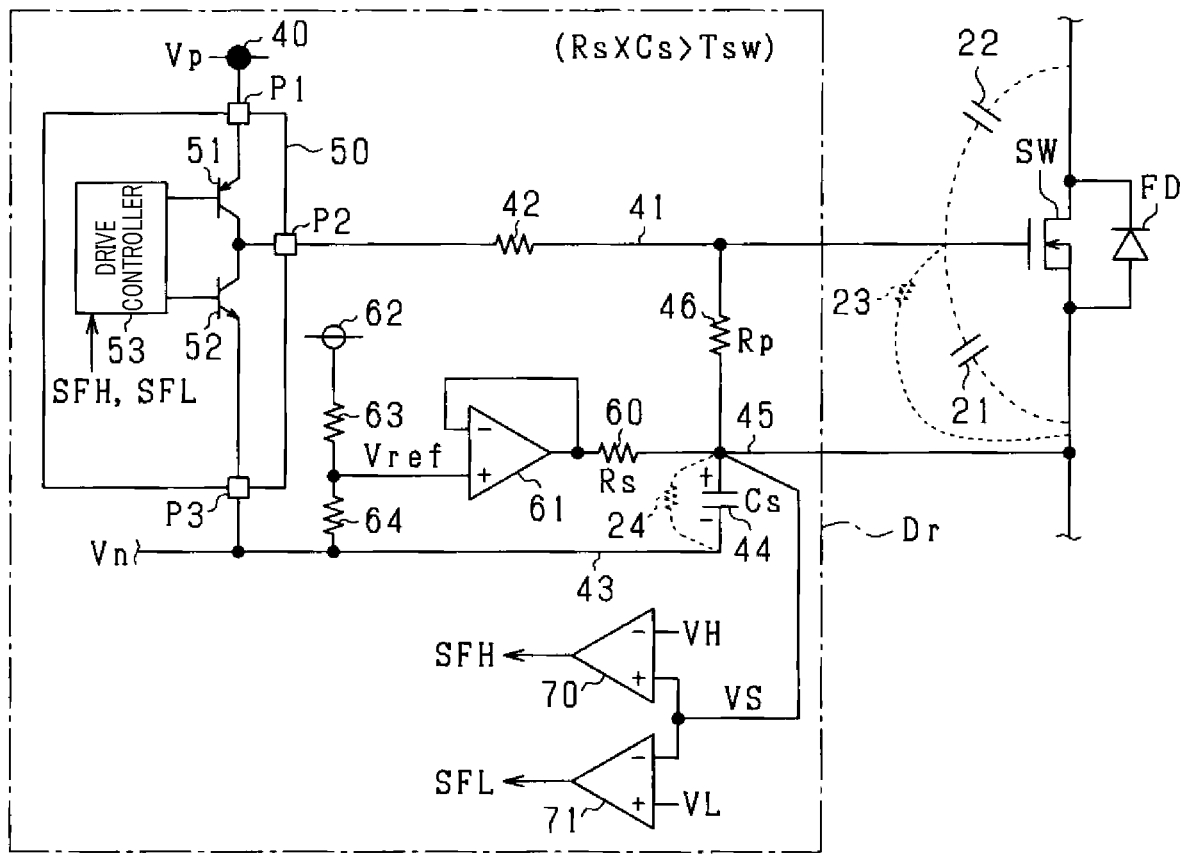
FIG. 10 is a schematic circuit diagram of a drive circuit according to a seventh embodiment.

FIG. 10 shows the configuration of a drive circuit Dr according to a seventh embodiment.

The drive circuit Dr according to the seventh embodiment is similar to that according to the first embodiment. Therefore, only the differences therebetween will be described hereinafter.

As shown in FIG. 10, in the present embodiment, the drive circuit Dr further includes a first comparator 70 and a second comparator 71, in comparison with the drive circuit Dr according to the first embodiment (see FIG. 2).

In the present embodiment, the drive controller 53 and the first and second comparators 70 and 71 together constitute a diagnoser that diagnoses abnormalities occurring in the drive circuit Dr.

Specifically, to the high-potential terminal of the capacitor 44, there are connected both a non-inverting input terminal of the first comparator 70 and an inverting input terminal of the second comparator 71. Consequently, the source voltage Vs is inputted to both the non-inverting input terminal of the first comparator 70 and the inverting input terminal of the second comparator 71.

To an inverting input terminal of the first comparator 70, there is inputted an over-voltage threshold VH. To a non-inverting input terminal of the second comparator 71, there is inputted an under-voltage threshold VL that is lower than the over-voltage threshold VH. Both a first signal SFH that is an output signal of the first comparator 70 and a second signal SFL that is an output signal of the second comparator 71 are inputted to the drive controller 53.

The drive controller 53 performs, based on the first and second signals SFH and SFL, an abnormality diagnosis process for diagnosing whether an over-voltage abnormality or an under-voltage abnormality has occurred. This process is based on a phenomenon that a voltage drop occurs across the limiting resistor 60 when electric current flows through the limiting resistor 60.

The over-voltage abnormality is an abnormality in which leakage current flowing between the gate and the source of the switch SW increases. The leakage current may flow, for example, along a leakage current path 23 formed between the gate and the source of the switch SW as shown in FIG. 10.

When the over-voltage abnormality occurs, electric current, which flows from the first electrical path 41 to the limiting resistor 60 bypassing the pull-down resistor 46, increases. At the same time, the operational amplifier 61 operates to keep the potential difference of the second end of the limiting resistor 60 (or the output terminal of the operational amplifier 61) with respect to the second electrical path 43 at the reference voltage Vref. Thus, the potential difference (>0) of the first end of the limiting resistor 60 with respect to the second end of the limiting resistor 60 increases. Consequently, the source voltage Vs increases to become higher than the over-voltage threshold VH, changing the logic level of the first signal SFH from L (or a low level) to H (or a high level). In addition, the logic level of the second signal SFL is kept at L when the over-voltage abnormality occurs.

On the other hand, the under-voltage abnormality is an abnormality in which leakage current flowing between the second electrical path 43 and the third electrical path 45 increases. The leakage current may flow, for example, along a leakage current path 24 formed between the high-voltage and low-voltage terminals of the capacitor 44 as shown in FIG. 10.

When the under-voltage abnormality occurs, electric current flowing from the pull-down resistor 46 to the second electrical path 43 increases. At the same time, the operational amplifier 61 operates to keep the potential difference of the second end of the limiting resistor 60 (or the output terminal of the operational amplifier 61) with respect to the second electrical path 43 at the reference voltage Vref. Thus, the potential difference (<0) of the first end of the limiting resistor 60 with respect to the second end of the limiting resistor 60 increases. Consequently, the source voltage Vs drops to become lower than the under-voltage threshold VL, changing the logic level of the second signal SFL from L to H. In addition, the logic level of the first signal SFH is kept at L when the under-voltage abnormality occurs.

Figure 11:
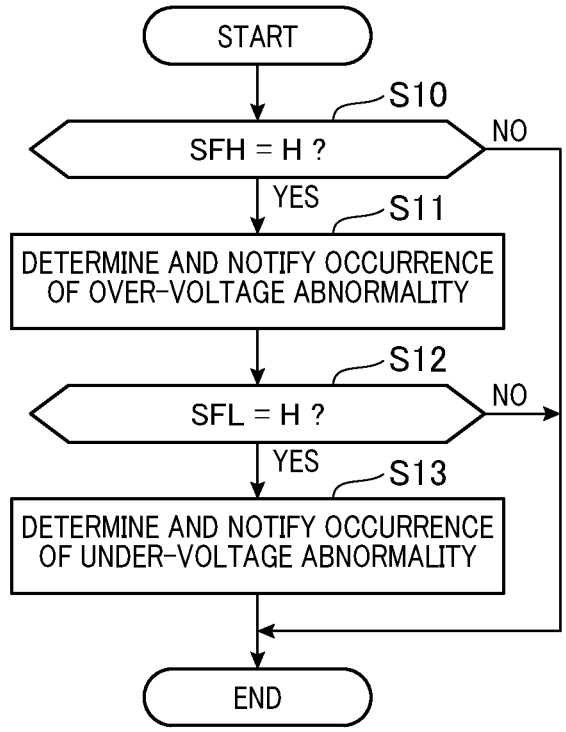
FIG. 11 is a flowchart illustrating an abnormality diagnosis process performed by a drive controller of the drive circuit according to the seventh embodiment.

FIG. 11 shows the abnormality diagnosis process performed by the drive controller 53. This process is repeated in a predetermined cycle.

First, at step S10, the drive controller 53 determines whether the logic level of the first signal SFH is H.

If the determination at step S10 results in a "YES" answer, the process proceeds to step S11. In contrast, if the determination at step S10 results in a "NO" answer, the process directly goes to the end.

At step S11, the drive controller 53 determines that the over-voltage abnormality has occurred. Then, the drive controller 53 notifies an external control apparatus (not shown in FIG. 10) of the occurrence of the over-voltage abnormality.

At subsequent step S12, the drive controller 53 further determines whether the logic level of the second signal SFL is H.

If the determination at step S12 results in a "YES" answer, the process proceeds to step S13. In contrast, if the determination at step S12 results in a "NO" answer, the process directly goes to the end.

At step S13, the drive controller 53 determines that the under-voltage abnormality has occurred. Then, the drive controller 53 notifies the external control apparatus of the occurrence of the under-voltage abnormality. Thereafter, the process goes to the end.

According to the present embodiment, it is also possible to achieve the same advantageous effects as described in the first embodiment.

Moreover, in the present embodiment, the drive circuit Dr further includes the diagnoser that is constituted of the drive controller 53 and the first and second comparators 70 and 71. The diagnoser diagnoses both the over-voltage abnormality and the under-voltage abnormality based on the potential on the first end side of the AC suppressor (i.e., the limiting resistor 60 in the present embodiment). Consequently, when either the over-voltage abnormality or the under-voltage abnormality has occurred, it is possible to take, in a timely manner, countermeasures such as notifying the external control apparatus of the occurrence of the abnormality.

Eighth Embodiment

Figure 12:
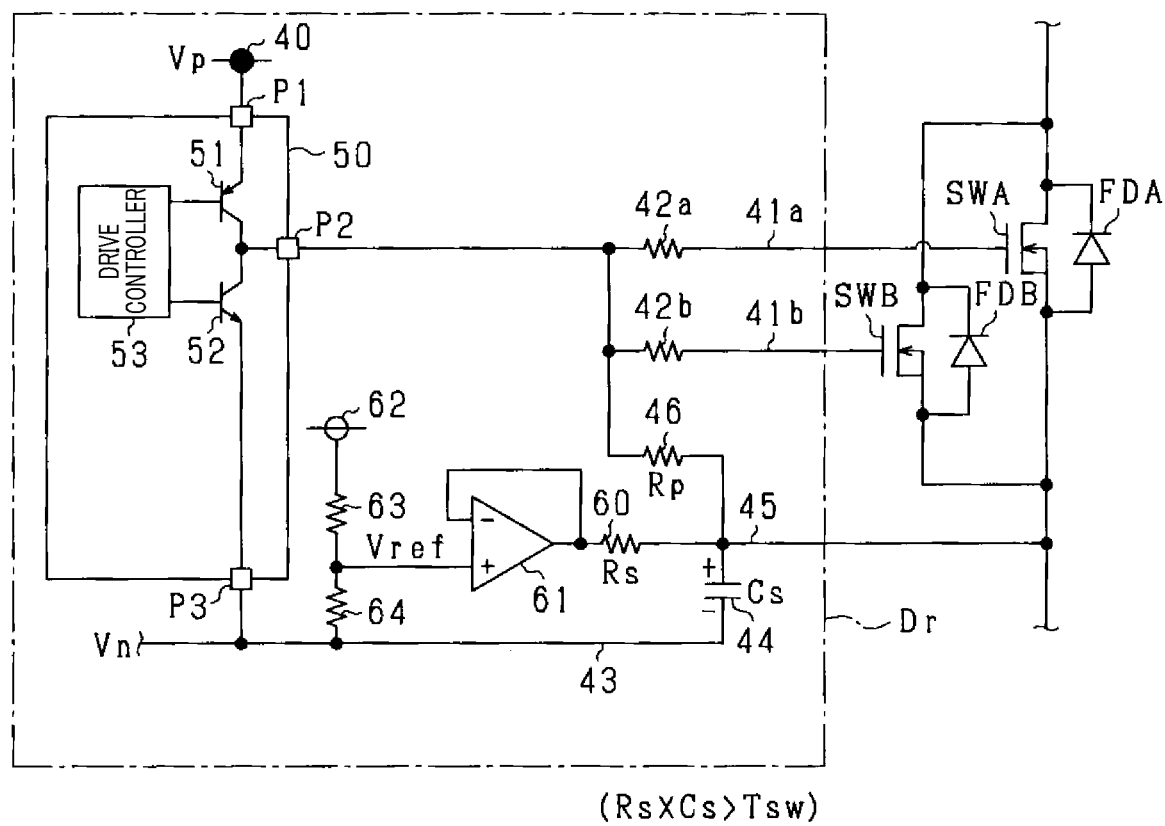
FIG. 12 is a schematic circuit diagram of a drive circuit according to an eighth embodiment.

FIG. 12 shows the configuration of a drive circuit Dr according to an eighth embodiment.

The drive circuit Dr according to the eighth embodiment is similar to that according to the first embodiment. Therefore, only the differences therebetween will be described hereinafter.

As described previously, in the first embodiment, each of the upper and lower arms of the three phases of the inverter 20 is configured with a single switch SW. That is, the inverter 20 includes a total of six switches SW. Moreover, the inverter 20 includes six drive circuits Dr each of which drives a corresponding one of the six switches SW (see FIGS. 1-2).

In comparison, in the present embodiment, each of the upper and lower arms of the three phases of the inverter 20 is configured with a plurality of parallel-connected switches, more particularly with a pair of parallel-connected switches SWA and SWB. That is, the inverter 20 includes a total of six pairs of parallel-connected switches SWA and SWB. Moreover, the inverter 20 includes six drive circuits Dr each of which drives a corresponding one of the six pairs of parallel-connected switches SWA and SWB.

In the present embodiment, all of the drive circuits Dr have the same configuration. Therefore, for the sake of avoiding redundancy, only one of the drive circuits Dr and the corresponding pair of parallel-connected switches SWA and SWB will be described in detail with reference to FIG. 12.

As shown in FIG. 12, of the pair of parallel-connected switches, the first switch SWA has a first body diode FDA connected in antiparallel thereto while the second switch SWB has a second body diode FDB connected in antiparallel thereto.

In the present embodiment, each of the first and second switches SWA and SWB is implemented by an N-channel MOSFET. The drains of the first and second switches SWA and SWB are connected to each other, while the sources of the first and second switches SWA and SWB are connected to each other.

In the drive circuit Dr, the first electrical path 41, which is connected to the second terminal P2 of the drive IC 50, branches into first and second branch electrical paths 41a and 41b.

The gate of the first switch SWA is connected to the second terminal P2 of the drive IC 50 via the first branch electrical path 41a. In addition, in the first branch electrical path 41a, there is provided a first gate resistor 42a.

The gate of the second switch SWB is connected to the second terminal P2 of the drive IC 50 via the second branch electrical path 41b. In addition, in the second branch electrical path 41b, there is provided a second gate resistor 42b.

The pull-down resistor 46 has its first end connected to the branch point between the first and second branch electrical paths 41a and 41b. That is, the first end of the pull-down resistor 46 is connected to both the first and second gate resistors 42a and 42b.

Moreover, the pull-down resistor 46 has its second end connected to the third electrical path 45. Thus, the first end of the limiting resistor 60 (or the AC suppressor) is connected to both the first and second branch electrical paths 41a and 41b via the pull-down resistor 46. In addition, the second end of the limiting resistor 60 is connected to the output terminal of the operational amplifier 61 (or the connection terminal of the DC voltage generator).

According to the present embodiment, it is also possible to achieve the same advantageous effects as described in the first embodiment.

Moreover, in the present embodiment, the drive circuit Dr drives both the first and second switches SWA and SWB that are connected in parallel to each other. Consequently, it is possible to ensure normal energization of the rotating electric machine 30 (see FIG. 1) by the inverter 20 even when either of the switches SWA and SWB is in a fault condition.

While the above particular embodiments have been shown and described, it will be understood by those skilled in the art that various modifications, changes, and improvements may be made without departing from the spirit of the present invention.

For example, in the first embodiment, the drive circuit Dr shown in FIG. 2 may be modified to have the capacitor 44, the limiting resistor 60, the operational amplifier 61, the reference power supply 62, the first resistor 63 and the second resistor 64 built in the drive IC 50.

In the third to the eighth embodiments, the limiting resistor 60 may be replaced with an inductor 65 as described in the second embodiment.

In the seventh embodiment, the diagnoser, which is constituted of the drive controller 53 and the first and second comparators 70 and 71, diagnoses both the over-voltage abnormality and the under-voltage abnormality. However, the diagnoser may be modified to diagnose only one of the over-voltage abnormality and the under-voltage abnormality.

In the above-described embodiments, the pull-down resistor 46 may be omitted from the drive circuit Dr.

In the above-described embodiments, each of the switches SW (or SWA, SWB) of the inverter 20 may be implemented by, for example, an IGBT instead of an N-channel MOSFET. In this case, the collector of the IGBT corresponds to a first terminal; the emitter of the IGBT corresponds to a second terminal; and the gate of the IGBT corresponds to a control terminal (or ON/OFF control terminal).

In the above-described embodiments, the present invention is directed to the drive circuits Dr for driving the switches SW (or SWA, SWB) of the three-phase inverter 20. However, the present invention may also be applied to drive circuits for driving switches of other electric power converters, the number of phases of each of these electric power converters being not limited to three.

What is claimed is:
1. A drive circuit that drives a switch,
the switch having a first terminal, a second terminal and a control terminal, the switch being configured to be turned to an ON state when a potential difference of the control terminal with respect to the second terminal becomes higher than or equal to an ON threshold voltage and turned to an OFF state when the potential difference becomes lower than an OFF threshold voltage, the switch allowing electric current to flow from the first terminal to the second terminal in the ON state and blocking electric current from flowing from the first terminal to the second terminal in the OFF state,
the drive circuit comprising:
a discharge path provided to connect the control terminal and the second terminal of the switch and discharge electric charge from the control terminal;
a capacitor provided in the discharge path and having a high-potential terminal connected to the second terminal side and a low-potential terminal connected to the control terminal side;
an AC suppressor configured to suppress an AC component of electric current, the AC suppressor having a first end and a second end, the first end being connected to a part of the discharge path between the high-potential terminal of the capacitor and the second terminal of the switch; and
a DC voltage generator that generates a reference DC voltage, the DC voltage generator having a connection terminal connected to the second end of the AC suppressor, the DC voltage generator being configured to regulate electric current flowing between the connection terminal and the AC suppressor so as to keep a potential of the part of the discharge path between the high-potential terminal of the capacitor and the second terminal of the switch higher than a potential of the low-potential terminal of the capacitor.

2. The drive circuit as set forth in claim 1, wherein the AC suppressor is constituted of a resistor.

3. The drive circuit as set forth in claim 2, wherein a resistance of the resistor and a capacitance of the capacitor are set to satisfy the following relationship: Rs×Cs>Tsw, where Rs is the resistance of the resistor, Cs is the capacitance of the capacitor and Tsw is a switching period of the switch.

4. The drive circuit as set forth in claim 1, wherein the AC suppressor is constituted of an inductor.

5. The drive circuit as set forth in claim 4, wherein an inductance of the inductor and a capacitance of the capacitor are set to satisfy the following relationship: $\sqrt{(Ls \times Cs)} > Tsw$, where Ls is the inductance of the inductor, Cs is the capacitance of the capacitor and Tsw is a switching period of the switch.

6. The drive circuit as set forth in claim 1, wherein the DC voltage generator comprises an operational amplifier that has:
   an inverting input terminal connected to one of the first and second ends of the AC suppressor;
   a non-inverting input terminal to which the reference DC voltage is applied; and
   an output terminal that constitutes the connection terminal of the DC voltage generator.

7. The drive circuit as set forth in claim 1, further comprising a diagnoser configured to diagnose at least one of a first abnormality and a second abnormality based on a potential on the first end side of the AC suppressor, the first abnormality being an abnormality in which leakage current flowing between the control terminal and the second terminal of the switch increases, the second abnormality being an abnormality in which leakage current flowing between the high-potential terminal side and the low-potential terminal side of the capacitor increases.

* * * * *